United States Patent
Song et al.

(10) Patent No.: US 12,173,133 B2
(45) Date of Patent: Dec. 24, 2024

(54) PREPARING METHOD FOR CONDUCTIVE COMPOSITE, CONDUCTIVE COMPOSITE AND PIEZORESISTIVE DEVICE USING THE SAME

(71) Applicants: HYUNDAI MOTOR COMPANY, Seoul (KR); KIA CORPORATION, Seoul (KR)

(72) Inventors: Kyong Hwa Song, Yongin-si (KR); Gwan Sik Kim, Suwon-si (KR); Deok Woo Yun, Hwaseong-si (KR); Min Jae Lee, Seongnam-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 262 days.

(21) Appl. No.: 17/748,787

(22) Filed: May 19, 2022

(65) Prior Publication Data
US 2023/0212371 A1    Jul. 6, 2023

(30) Foreign Application Priority Data
Dec. 30, 2021 (KR) .................. 10-2021-0193298

(51) Int. Cl.
| | | |
|---|---|---|
| *H01B 1/20* | (2006.01) | |
| *C08K 3/04* | (2006.01) | |
| *C08K 5/06* | (2006.01) | |
| *C09D 5/24* | (2006.01) | |
| *H01B 1/04* | (2006.01) | |
| *H10N 30/85* | (2023.01) | |

(52) U.S. Cl.
CPC .............. *C08K 3/041* (2017.05); *C08K 5/06* (2013.01); *C09D 5/24* (2013.01); *H01B 1/04* (2013.01); *H10N 30/85* (2023.02); *C08K 2201/001* (2013.01)

(58) Field of Classification Search
CPC .... C08K 3/041; C08K 5/06; C08K 2201/001; C09D 5/24; H01B 1/04; H01B 1/02; H01B 1/20; H01B 1/22; H01B 1/24
See application file for complete search history.

(56) References Cited

U.S. PATENT DOCUMENTS

| | | | | |
|---|---|---|---|---|
| 4,231,901 A | * | 11/1980 | Berbeco | H01L 23/60 521/137 |
| 7,504,052 B2 | * | 3/2009 | Ehbing | C08K 7/06 252/511 |
| 8,643,463 B2 | | 2/2014 | Samah | |
| 10,378,983 B2 | | 8/2019 | Shere et al. | |
| 10,955,300 B2 | | 3/2021 | Zeng et al. | |
| 11,029,222 B2 | | 6/2021 | Cho et al. | |
| 11,040,873 B2 | | 6/2021 | Jeon et al. | |
| 2012/0235781 A1 | | 9/2012 | Samah | |
| 2014/0272375 A1 | * | 9/2014 | Haider | H01B 19/04 427/122 |
| 2017/0199095 A1 | | 7/2017 | Shere et al. | |

FOREIGN PATENT DOCUMENTS

| | | | | |
|---|---|---|---|---|
| CN | 109575330 A | | 4/2019 | |
| CN | 110698723 A | * | 1/2020 | ............. C01B 32/19 |
| CN | 111167421 A | * | 5/2020 | ............. B01J 20/20 |
| KR | 10-1544386 B1 | | 8/2015 | |
| KR | 10-1650827 B1 | | 8/2016 | |
| KR | 2017-0029539 A | | 3/2017 | |
| KR | 10-2075911 B1 | | 2/2020 | |
| KR | 10-2242936 B1 | | 4/2021 | |
| WO | 2011/065921 A1 | | 6/2011 | |

OTHER PUBLICATIONS

Facile one-pot synthesis of superhydrophobic reduced graphene oxidecoated polyurethane sponge at the presence of ethanol for oil-water separation, Xia et al. (Chemical Engineering Journal 345 (2018) 648-658).*

* cited by examiner

*Primary Examiner* — Haidung D Nguyen
(74) *Attorney, Agent, or Firm* — MCDONNELL BOEHNEN HULBERT & BERGHOFF LLP (57) ABSTRACT

A method of preparing a conductive composite includes immersing a porous base material in a conductive coating solution, and drying the conductive coating solution on the porous base material to form a conductive coating layer on the porous base material. The conductive coating solution includes conductive particles and a solvent, and the surface tension of the solvent is lower than the surface tension of the porous base material by 8 mN/m or more, and a conductive composite is prepared therefrom.

12 Claims, 5 Drawing Sheets

PREPARING METHOD FOR CONDUCTIVE COMPOSITE, CONDUCTIVE COMPOSITE AND PIEZORESISTIVE DEVICE USING THE SAME

CROSS REFERENCE TO RELATED APPLICATIONS

This application claims under 35 U.S.C. § 119 (a) the benefit of Korean Patent Application No. 10-2021-0193298 filed on Dec. 30, 2021, the entire contents of which are incorporated herein by reference in its entirety.

BACKGROUND

(a) Technical Field

The present disclosure relates to a conductive composite having improved adhesion stability of a conductive coating layer, and improved resistance change, flexibility and elastic recovery according to pressure, and a method of preparing the same.

(b) Background Art

The piezoresistive effect refers to a change in the electrical resistance value of a material due to external pressure or force. This change in electrical resistance value usually occurs due to two causes, change in shape and/or change in conductivity of the material. In this case, since the piezoresistive effect causes only a change in the electrical resistance value, it is distinguished from the piezoelectric effect of generating a voltage. A device using this piezoresistive effect may include a pressure sensor or a pressure transducer that detects pressure, vibration, acceleration, and the like.

On the other hand, conventional rigid pressure sensors have a limitation in that it is difficult to properly perform their functions on the curved surfaces of various industrial equipment such as automobiles and electrical appliances. As an alternative to this, sensors using a material having high flexibility and improved elastic recovery have been proposed. For example, Korean Patent No. 10-1650827 discloses a conductive composite composition comprising a polymer base material, a conductive filler, a solvent, a plasticizer and a dispersant, and a piezoresistive device comprising a conductive composite layer prepared using the composition. However, there is a limitation in that a piezoresistive device prepared by printing a composition comprising a polymer base material and a conductive filler as in Korean Patent No. 10-1650827 is prepared in a 2D planar shape and exhibits conductive properties when a large amount of conductive material is included as a composite material in which an elastic polymer becomes a base material. As described above, the piezoresistive device comprising a large amount of conductive material exhibits lower conductive properties and higher resistance value than the intrinsic conductivity of the conductive material, thereby resulting in low sensing sensitivity, and thus, a large amount of conductive material must be added for high sensing sensitivity. In addition, the piezoresistive device as in Korean Patent No. 10-1650827 has a limitation in that only the pressure on the upper portion, which is a specific direction, is sensed in a 2D shape. As an alternative to this, when a piezoresistive device is prepared by coating a composition comprising a conductive material on a base material, there is a limitation in that the prepared piezoresistive device lacks durability, so that it is difficult to commercialize it.

In addition, Korean Patent No. 10-2075911 discloses a composite sensor comprising a sensor main body formed by coating a nanomaterial on a porous body, and electrodes formed on both sides of the sensor main body, wherein the sensor main body is formed by impregnating the porous body in a dispersion solution in which the nanomaterial is dispersed in an aprotic solvent. However, in the sensor prepared by the method of impregnating a porous body in a dispersion solution such as the composite sensor of Korean Patent No. 10-2075911, there are problems in that the shape of the porous body is deformed due to swelling as it is wetted with the solution, and the shape of the porous body is completely twisted during drying after impregnation. Further, there is a problem in that such deformation of the porous body remarkably reduces the reproducibility of the method of preparing the piezoresistive material, and the coating of the conductive material due to the shape deformation also becomes non-uniform. Furthermore, the method comprising the process of drying after impregnation as in Korean Patent No. 10-2075911 has a problem in that the deformation of the porous body, which is a sensor main body, occurs during the drying process after impregnation, and thus the surface adhesion stability of the conductive material is deteriorated, making it difficult to prepare a durable sensor.

Therefore, there is a need for research and development on a conductive composite in which a conductive material is evenly coated on the surface of a porous base material and that has improved adhesion stability of a conductive coating layer, thus improved durability, and improved resistance change, flexibility and elastic recovery according to pressure, and a method of preparing the same.

SUMMARY

Accordingly, the present disclosure provides a conductive composite in which a conductive material is evenly coated on the surface of a porous base material and that has improved adhesion stability of a conductive coating layer, and improved resistance change, flexibility and elastic recovery according to pressure, and a method of preparing a conductive composite that may be prepared without deformation after coating even if the area of the porous base material increases.

The present disclosure provides a method of preparing a conductive composite, comprising the steps of immersing a porous base material in a conductive coating solution, and drying the conductive coating solution on the porous base material to form a conductive coating layer on the porous base material. The conductive coating solution includes conductive particles and a solvent, and the surface tension of the solvent is lower than the surface tension of the porous base material by 8 mN/m or more.

Further, the present disclosure provides a conductive composite prepared by the method.

Furthermore, the present disclosure provides a piezoresistive device comprising the conductive composite.

In addition, the present disclosure provides a piezoresistive sensor or piezoresistive switch comprising the piezoresistive device.

The method according to the present disclosure may prepare a conductive composite without deformation after coating even if the area of a porous base material increases, and may evenly coat a conductive material on the surface of the porous base material. Therefore, the conductive composite prepared by the method has improved adhesion stability of a conductive coating layer, improved resistance change, flexibility and elastic recovery according to pressure, so that it is very suitable for application to materials and the like of piezoresistive devices in various fields using resistance change according to pressure.

In addition, the method according to the present disclosure comprises a coating layer forming step capable of preventing a change in shape of a porous base material while having improved adhesion of a conductive coating layer, thereby preserving the properties of the porous base material while reducing the amount of a conductive material used. Due to this, the conductive composite prepared by the method may be suitably applied as a 3D-type piezoresistive sensor capable of having flexibility and sensing piezoresistance in multiple directions.

DETAILED DESCRIPTION

Hereinafter, the present disclosure will be described in detail.

Method of Preparing Conductive Composite

The method of preparing the conductive composite according to the present disclosure comprises the steps of immersing a porous base material in a conductive coating solution, and drying the conductive coating solution on the porous base material to form a conductive coating layer on the porous base material.

Step of Immersion

In this step, a porous base material is immersed in a conductive coating solution.

The porous base material serves to support the conductive particles in the conductive coating solution and impart piezoresistance to the conductive composite through a change in current flow due to compression deformation.

In addition, the porous base material may be, for example, at least one polymer selected from the group consisting of a polyurethane-based polymer, a polystyrene-based polymer, a polyphenol-based polymer, a polyvinyl chloride-based polymer, a polymelamine-based polymer, and a polysiloxane-based polymer, or a copolymer thereof. In addition, the porous base material may have a multilayer structure in which a base material made of the polymer as described above or a copolymer thereof is overlapped. Specifically, the porous base material may comprise a polyurethane-based polymer.

The porous base material may comprise a foam having a density of 0.01 to 0.1 g/cc. Specifically, the porous base material may comprise a foam having a density of 0.01 to 0.08 g/cc or 0.02 to 0.05 g/cc.

The conductive coating solution includes conductive particles and a solvent.

The conductive particles serve to be coated on the porous base material to selectively impart conductivity to the conductive composite by an electrical tunneling effect.

In this case, the conductive particles may be used without any particular limitation as long as it is a conventional conductive material, and may comprise, for example, one or more selected from the group consisting of carbon nanotubes (CNTs), carbon nanowires, graphene, and carbon nanoparticles.

In addition, the average diameter of the conductive particles may be smaller than the average diameter of the pores of the porous base material. That is, the conductive particles may be supported in the pores of the porous base material. For example, the average diameter of the conductive particles may be 5 nm to 100 nm, specifically, 5 to 10 nm. If the average diameter of the conductive particles is less than the above range, agglomeration of the particles is severe and dispersion in a solvent is difficult, making it difficult to prepare a coating solution, and if it exceeds the above range, conductive particles may protrude from the surface of the coating layer during coating of the coating solution, thereby reducing the smoothness of the coating layer. Such protrusion of the conductive particles may cause problems in sensing the resistance value by causing the conductive particles to fall off or deform from the coating layer due to repeated pressure later. In addition, the conductive particles having an average diameter of more than the above range may have low conductivity of the material itself, thereby lowering the sensitivity of the prepared conductive composite.

The solvent serves to evenly disperse the conductive particles and form a conductive coating layer on the porous base material, thereby evenly dispersing the conductive particles on the porous base material. In this case, the solvent may be a coalescing agent, and thus it is gradually volatilized when the conductive coating solution is dried, and the conductive particles in the conductive coating layer may form a network with each other. The coalescing agent may allow the conductive particles to be uniformly spread and stably coated on the surface of the porous base material while it is slowly volatilized.

In addition, the surface tension of the solvent is lower than the surface tension of the porous base material by 8 mN/m or more. If the surface tension of the solvent is lower than the surface tension of the porous base material by less than 8 mN/m, the conductive coating solution may be absorbed into the porous base material in a large amount to twist the shape of the porous base material after drying. If the difference in surface tension between the solvent and the porous base material is within the above range, there are effects that the shape of the porous base material is prevented from being deformed when the conductive coating layer is formed, and adhesion stability of the conductive coating layer is improved. Due to this, the method according to the present disclosure may prepare a conductive composite having improved durability because there is little deformation even under repeated external pressure for piezoresistive sensing even using a large-area porous base material.

Specifically, the surface tension of the solvent may be lower than the surface tension of the porous base material by 8 mN/m or more and 15 mN/m or less. If the difference between the surface tension of the solvent and the surface tension of the porous base material is within the above range, it is possible to prevent problems in which the conductive coating solution is excessively absorbed into the porous base material to twist the shape of the porous base material, and the conductive coating solution is too little absorbed into the porous base material to lead to insufficient conductivity of the prepared conductive composite.

The constituent molecules of the solvent may contain at least one functional group contained in the constituent molecules of the porous base material. If the constituent molecules of the solvent contain at least one functional group contained in the constituent molecules of the porous base material as described above, the affinity between the porous base material and the conductive coating solution is improved, and the wettability of the conductive coating solution to the surface of the porous base material is improved, so that the adhesion stability of the conductive coating layer may be improved.

Specifically, the porous base material may comprise a polyurethane-based polymer, and the solvent may comprise an ester group (—C(=O)—O—) in a molecule. Due to this, the solvent has improved affinity with the porous base material, and thus adhesion stability of the prepared conductive coating layer may be improved.

In addition, the solvent may have improved wettability with the conductive particles.

The solvent may include a glycol-ether-based compound. For example, the solvent may comprise one or more selected from the group consisting of diethylene glycol monoethyl ether acetate, propylene glycol phenyl ether, and propylene glycol monomethyl ether.

The conductive coating solution may comprise 1 to 5% by weight of the conductive particles and 60 to 80% by weight of the solvent. Specifically, the conductive coating solution may comprise 1.5 to 4.0% by weight of the conductive particles and 65 to 80% by weight of the solvent. If the content of the conductive particles in the conductive coating solution is less than the above range, the prepared conductive composite may have a low conductivity and thus a sensing speed for a change in a resistance value may be slow, thereby making it difficult to use as a sensor. On the other hand, if the content of the conductive particles in the coating solution exceeds the above range, it is advantageous in terms of conductivity due to a large amount of conductive particles, but the flowability of the coating solution is lowered, so that it is difficult to form a coating layer. Specifically, if the coating solution contains an excess of conductive particles, when the porous base material is immersed in the coating solution, only the surface of the porous base material may be coated due to the phenomenon that the coating solution does not penetrate (permeate) into the interior of the porous base material and agglomerates.

In addition, if the content of the solvent in the coating solution exceeds the above range, there may be problems in which it is difficult to remove the solvent by drying in the step of forming the conductive coating layer, and the flowability of the coating solution increases, so that the prepared conductive coating layer becomes thin or it is difficult to move for a subsequent drying step.

In addition, the conductive coating solution may have a viscosity at 25° C. of 3,000 to 10,000 cP, 4,000 to 8,000 cP, or 5,000 to 7,000 cP. If the viscosity at 25° C. of the conductive coating solution is within the above range, the conductive coating layer may be easily prepared with the number of coatings within 3 times during coating. On the other hand, if the viscosity of the conductive coating solution is less than the above range, there is a limit in that the number of coatings must be performed four or more times, which is inefficient in the process, and if the viscosity exceeds the above range, there are a problem that the coating solution is not uniformly applied, and thus the surface is not smooth after coating, and a limitation that it is not easy to control the conductivity of the prepared composite.

The conductive coating solution may further comprise a dispersant and a binder.

The dispersant serves to improve the dispersibility of the conductive particles in the conductive coating solution, and may be used without any particular limitation as long as it is commonly used to disperse the conductive particles. In addition, as commercially available products of the dispersant, BYK company's 9077, Triton X-100, sodium dodecyl sulfate (SDS), and the like may be used.

The binder serves to improve the adhesion of the conductive coating layer, and may be used without any particular limitation as long as it is commonly used. In addition, the binder may be a polyester-based binder.

The conductive coating solution may comprise 1 to 5% by weight of the dispersant and 5 to 25% by weight of the binder. Specifically, the conductive coating solution may comprise 1.5 to 3.5% by weight of the dispersant and 10 to 20% by weight of the binder. If the content of the dispersant in the conductive coating solution is less than the above range, the dispersion stability of the coating solution is lowered, and if it exceeds the above range, the dispersant may act as an impurity, causing a problem of lowering the conductivity of the conductive composite. In addition, if the amount of the binder in the conductive coating solution is less than the above range, the durability of the prepared conductive composite may be lowered due to insufficient adhesion of the coating layer, and if it exceeds the above range, there may be a problem in that the expression of the conductive properties of the conductive particles is insufficient.

Step of Forming a Conductive Coating Layer

In this step, the conductive coating solution on the porous base material is dried to form a conductive coating layer on the porous base material.

The drying may be performed at 100 to 150° C. for 10 to 70 minutes. Specifically, the drying may be performed at 110 to 130° C. for 20 to 60 minutes. If the drying temperature is less than the above range, the drying time becomes longer, lowering process efficiency, and if it exceeds the above range, there may be a problem that it dries quickly at high temperature and the solvent in the coating layer evaporates in a short time, so that it is difficult to form a conductive coating layer in which conductive particles are evenly dispersed.

For example, in the method according to the present disclosure, using the step of immersion and the step of drying to form the conductive coating layer as one cycle, 2 to 4 cycles may be performed. That is, in the method, using the step of immersion and the step of drying at 110 to 130° C. for 10 to 30 minutes to form a conductive coating layer as one cycle, 2 to 4 cycles may be performed.

The method according to the present disclosure as described above may prepare a conductive coating layer without deformation after coating even if the area of a porous base material increases, and may evenly coat conductive particles on the surface of the porous base material.

Conductive Composite

The conductive composite according to the present disclosure is prepared by the method as described above.

The conductive composite prepared by forming the conductive coating layer on the porous base material as described above may be prepared as a 3D shape in various thicknesses according to the thickness control of the porous base material, and has high sensitivity to sensing by including the conductive coating layer on the surface. In addition, the conductive composite may respond to pressing pressure from both sides according to the designed position of the electrode as well as pressing up and down. That is, the conductive composite also may sense pressure in multiple directions. In addition, since the conductive composite has improved flexibility and elastic recovery, which are characteristics of a porous base material, the sensing pressure has a wide range from low pressure to high pressure, so that it is easy to change into various shapes.

The conductive composite may be prepared in various thicknesses and in various shapes according to application fields and/or materials. For example, the conductive composite may have various shapes and various sizes from touch sensing by finger pressure to seat application pressure sensing for seating sensing.

The conductive composite according to the present disclosure as described above has improved adhesion stability of a conductive coating layer, improved resistance change, flexibility and elastic recovery according to pressure, so that it is very suitable for application to materials and the like of piezoresistive devices in various fields using resistance change according to pressure.

Piezoresistive Device

The piezoresistive device according to the present disclosure comprises the conductive composite.

The piezoresistive device may comprise a first electrode formed on one surface of the conductive composite, and a second electrode formed on the other surface of the conductive composite. In this case, the first electrode and the second electrode may be used without any particular limitation as long as they are the material and size of the electrode commonly applicable to the piezoresistive device.

The piezoresistive device has improved piezoresistive effect of changing resistance according to pressure and has improved flexibility and elastic recovery, so that it may be applied to various fields. In particular, the piezoresistive device has improved flexibility, so that it is very suitable to be applied to a place having a curved surface, such as an automobile, an electric/electronic product and the like.

Piezoresistive Sensor or Piezoresistive Switch

The piezoresistive sensor or piezoresistive switch according to the present disclosure comprises the piezoresistive device.

The piezoresistive sensor or piezoresistive switch comprises the piezoresistive device having improved piezoresistive effect, flexibility and elastic recovery, so that it has an advantage in that the piezoresistive effect is improved and the piezoresistive effect is less deteriorated even in a plurality of shape changes. Accordingly, the piezoresistive sensor or piezoresistive switch may be applied to products in various fields.

Hereinafter, the present disclosure will be described in more detail through examples. However, these examples are only for helping the understanding of the present disclosure, and the scope of the present disclosure is not limited to these examples in any sense.

EXAMPLES

Preparative Example 1. Preparation of Conductive Coating Solution-1

2.83% by weight of carbon nanotubes (CNTs, Jeno Tube 8A from JEIO Co., Ltd.) as conductive particles, 78.21% by weight of diethylene glycol monoethyl ether acetate (surface tension: 31.4 mN/m) as a solvent, 2.65% by weight of BYK company's BYK-9077 as a dispersant, and 16.31% by weight of a polyester-based binder (manufacturer: JBCaltek Co., Ltd. (Ansan, Korea); product name: JE-01) as a binder were mixed, and then treated with a 3-roll mill for 90 minutes to prepare a conductive coating solution-1.

The prepared conductive coating solution-1 had a viscosity at 25° C. of 6,600 cP.

Preparative Example 2. Preparation of Conductive Coating Solution-2

A conductive coating solution-2 was prepared in the same manner as in Preparative Example 1, except that ethanol (surface tension: 22.3 mN/m) was used instead of diethylene glycol monoethyl ether acetate as a solvent.

Preparative Example 3. Preparation of Conductive Coating Solution-3

A conductive coating solution-3 was prepared in the same manner as in Preparative Example 1, except that cyclohexanone (surface tension: 35.05 mN/m) was used instead of diethylene glycol monoethyl ether acetate as a solvent.

Preparative Example 4. Preparation of Conductive Coating Solution-4

A conductive coating solution-4 was prepared in the same manner as in Preparative Example 1, except that N-methyl-2-pyrrolidone (NMP; surface tension: 40.8 mN/m) was used instead of diethylene glycol monoethyl ether acetate as a solvent.

Example 1. Preparation of Conductive Composite-1

As a porous base material, a foam consisting of a polyurethane-based polymer (CG 80 from Form Works Co., Ltd.; density: 0.032 g/cc; surface tension: 40.0 mN/m) was cut into 420 mm×420 mm (width×length) and used.

Using immersing the foam in the conductive coating solution-1 of Preparative Example 1 for 30 seconds, and then drying at 120° C. for 20 minutes as one cycle, a total of 3 cycles were repeated to form a conductive coating layer on the porous base material, thereby preparing a conductive composite-1.

Comparative Examples 1 to 3

A conductive composite was prepared in the same manner as in Example 1, except that any one of Preparative Examples 2 to 4 was used instead of the conductive coating solution-1 of Preparative Example 1 as the conductive coating solution.

TABLE 1

| | Solvent | Surface Tension of Solvent (mN/m) | Difference in Surface Tension between Porous Base Material and Solvent (mN/m) |
|---|---|---|---|
| Example 1 | Diethylene glycol monoethyl ether acetate | 31.4 | 8.6 |
| Comparative Example 1 | Ethanol | 22.3 | 17.7 |
| Comparative Example 2 | Cyclohexanone | 35.05 | 4.95 |
| Comparative Example 3 | N-Methyl-2-pyrrolidone | 40.8 | 0.8 |

Test Example 1

Figure 1:
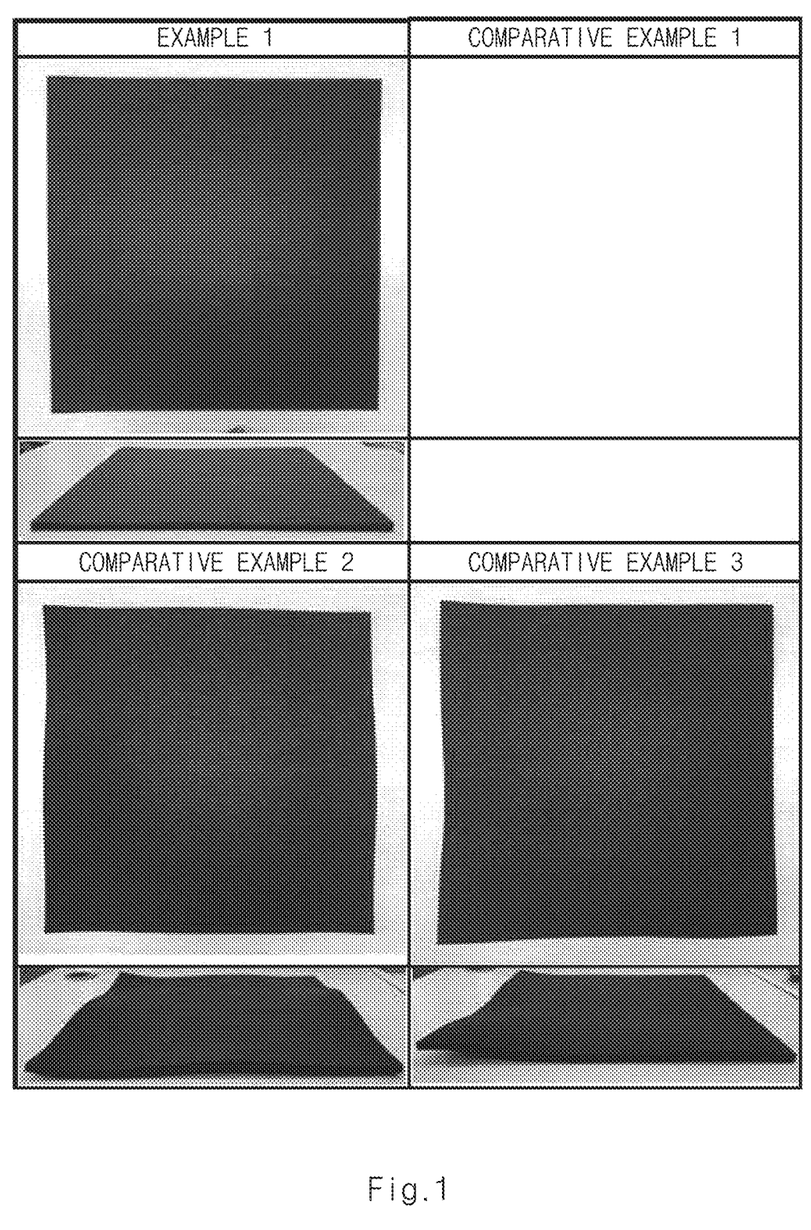
FIG. 1 is a photograph showing the appearance of a conductive composite of examples.
Figure 2:
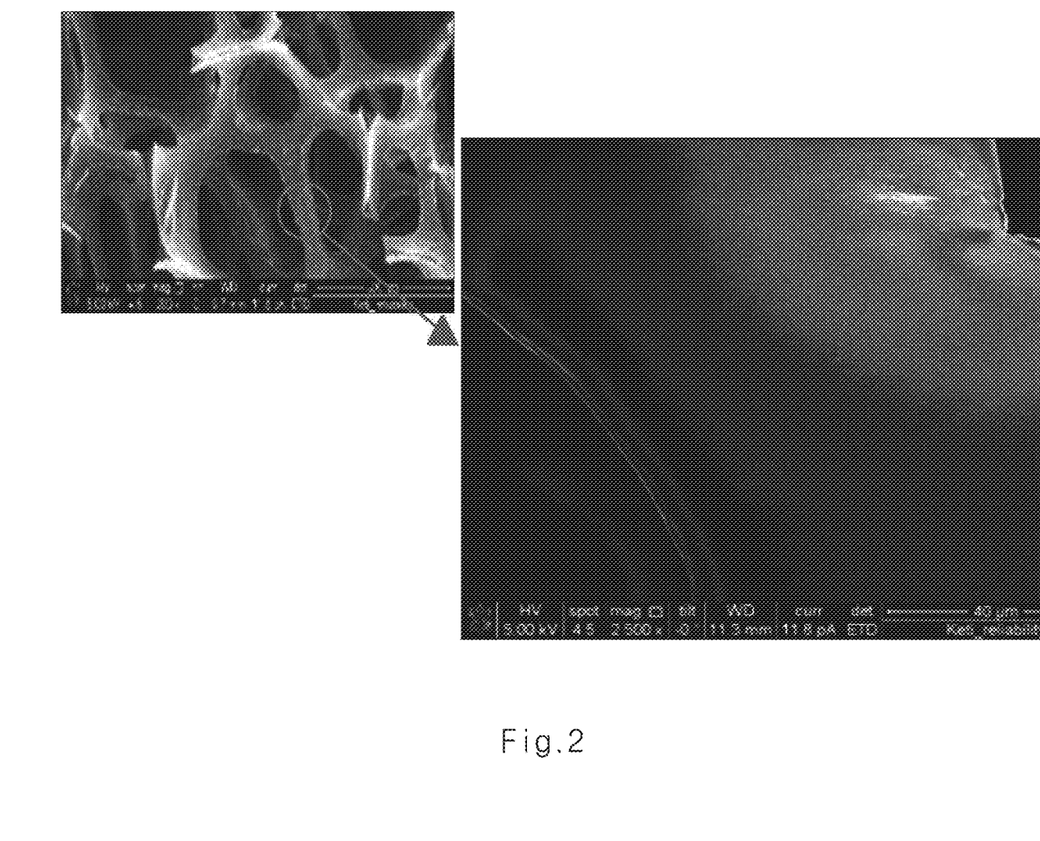
FIG. 2 is an SEM photograph of the porous base materials used in examples.
Figure 3:
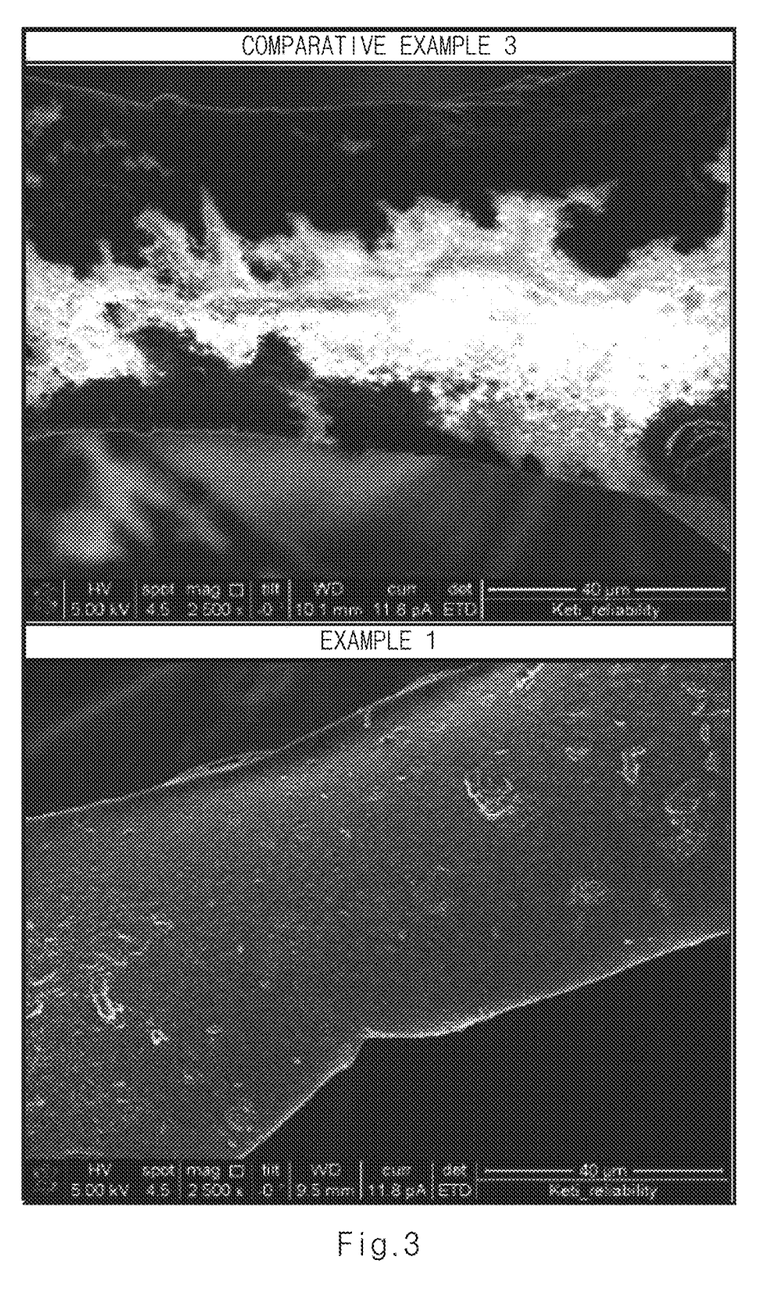
FIG. 3 is an SEM photograph of the conductive composites of Example 1 and Comparative Example 3.

For the conductive composites prepared in Example 1 and Comparative Examples 1 to 3, the appearance and SEM photographs by a scanning electron microscope were observed, and the results are shown in FIGS. 1 to 3. Specifically, FIG. 1 is an appearance photograph of the conductive composite, FIG. 2 is an SEM photograph of the porous base material, and FIG. 3 is an SEM photograph of the conductive composites of Example 1 and Comparative Example 3.

As shown in FIG. 1, it could be confirmed that the conductive composite of Example 1 had a shape similar to that of the porous base material, and no shape change occurred. On the other hand, the conductive composites of Comparative Examples 2 and 3 using a solvent having the surface tension of the solvent lower than that of the porous base material by less than 8 mN/m showed a twisted shape different from that of the porous base material. In addition, the conductive composites of Comparative Examples 2 and 3 tended to be easily torn due to increased surface area than the porous base material used.

As shown in FIG. 3, in the conductive composite of Example 1, it could be seen that a conductive coating layer in which conductive particles were uniformly and stably coated on the surface of the porous base material was formed. This is a result of stably forming the conductive coating layer as the CNTs as conductive particles form a network while diethylene glycol monoethyl ether acetate as a solvent of Example 1 is slowly evaporated. On the other hand, in the conductive composite of Comparative Example 3, it could be seen that conductive particles were not evenly coated on the surface of the porous base material.

Test Example 2

The conductive composite of Example 1 was cut to 10 mm×10 mm (width×length), and then a copper coil (electrode) was attached to one side and the other side thereof, and dried at 150° C. for 10 minutes to prepare a piezoresistive device. Thereafter, the piezoresistive effect was measured while pressurizing the piezoresistive device according to pressure using a resistance value measuring device, and the results are shown in FIG. 4.

Figure 4:
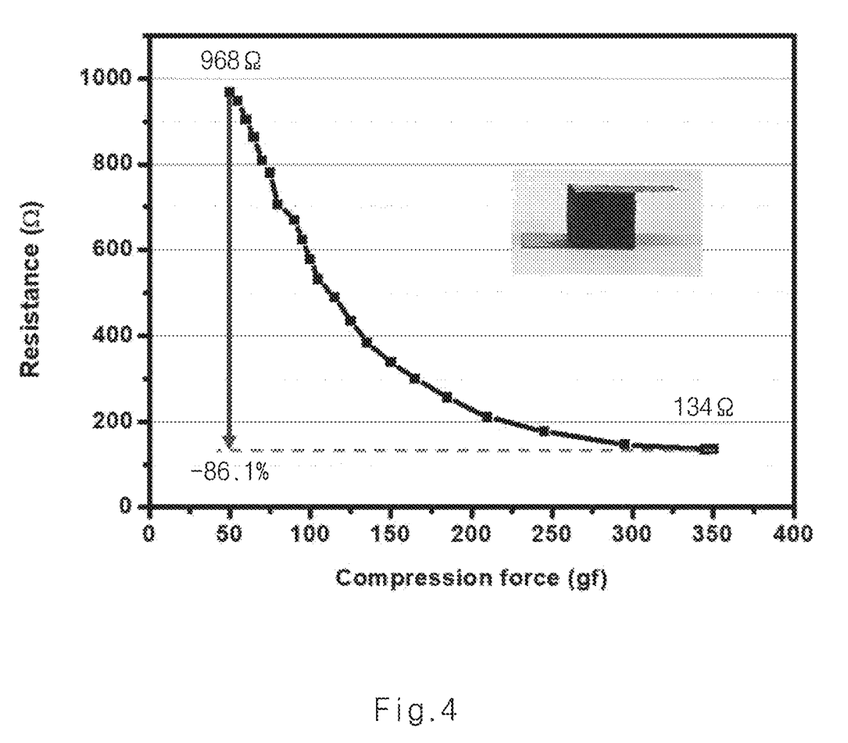
FIG. 4 is a graph showing a change in resistance value by pressurization of Test Example 2.

As shown in FIG. 4, it could be seen that the piezoresistive device comprising the conductive composite of Example 1 was very suitable as a piezoresistive device because the resistance was changed by pressurization.

Figure 5:
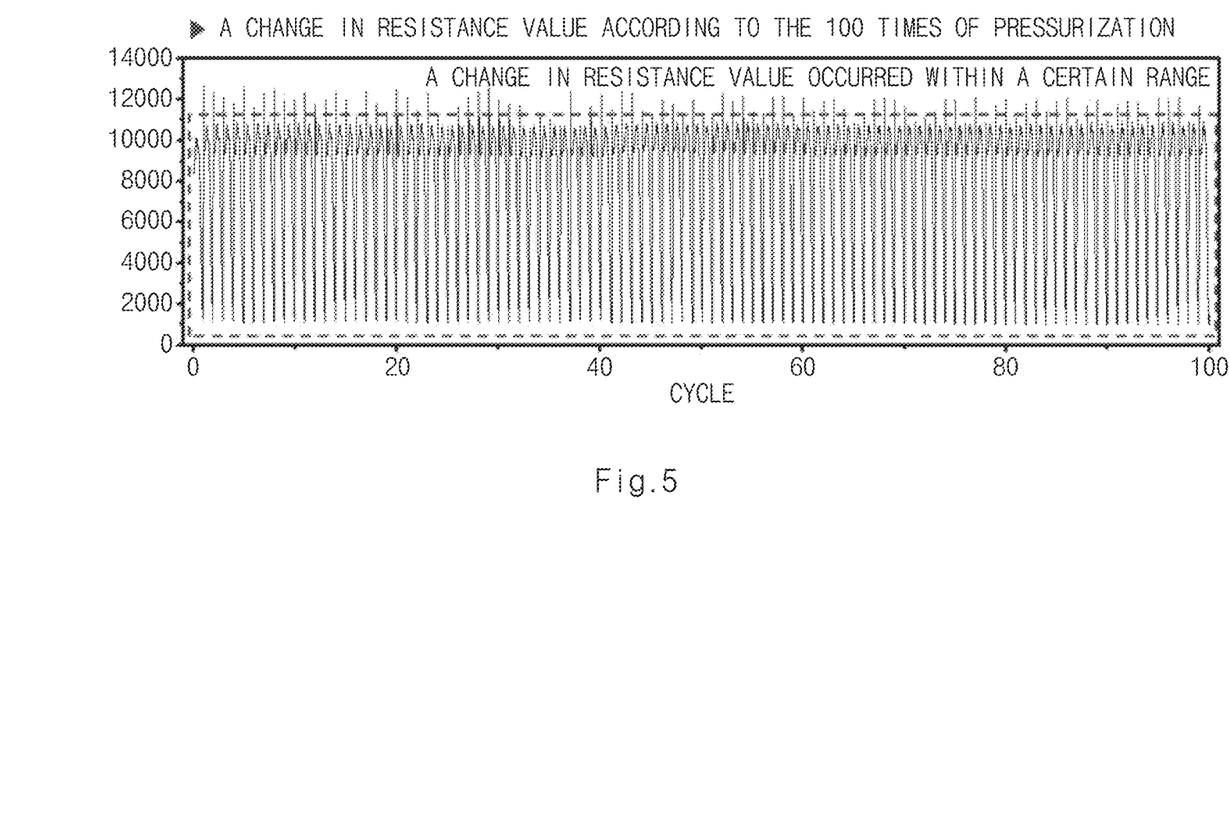
FIG. 5 is a graph showing a change in resistance value according to the number of times of pressurization of Test Example 2.

In addition, the resistance value was measured while pressurizing the piezoresistive device prepared as described above 100 times at a pressure of 0.45 kgf using the resistance value measuring device according to pressure, and a graph of the change in resistance value according to the number of pressurization is shown in FIG. 5.

As shown in FIG. 5, it could be confirmed that the piezoresistive device comprising the conductive composite of Example 1 was very suitable as a piezoresistive sensor or a piezoresistive switch because the change in resistance occurred within a certain range even when pressurized 100 times.

While a number of exemplary aspects and embodiments have been discussed above, those of skill in the art will recognize that still further modifications, permutations, additions and sub-combinations thereof of the features of the disclosed embodiments are still possible.

The invention claimed is:

1. A method of preparing a conductive composite, comprising the steps of:
   immersing a porous base material in a conductive coating solution; and
   drying the conductive coating solution on the porous base material to form a conductive coating layer on the porous base material;
   wherein the conductive coating solution includes conductive particles and a solvent;
   wherein a surface tension of the solvent is lower than a surface tension of the porous base material by 8 mN/m or more; and
   wherein a constituent molecules of the solvent contain at least one functional group contained in the constituent molecules of the porous base material.

2. The method of preparing the conductive composite according to claim 1, wherein the porous base material is at least one polymer selected from the group consisting of: a polyurethane-based polymer, a polystyrene-based polymer, a polyphenol-based polymer, a polyvinyl chloride-based polymer, a polymelamine-based polymer, and a polysiloxane-based polymer, or a copolymer thereof.

3. The method of preparing the conductive composite according to claim 1, wherein the porous base material comprises a foam having a density of 0.01 to 0.1 g/cc.

4. The method of preparing the conductive composite according to claim 1, wherein the conductive particles comprise one or more selected from the group consisting of: carbon nanotubes (CNTs), carbon nanowires, graphene, and carbon nanoparticles.

5. The method of preparing the conductive composite according to claim 1, wherein the surface tension of the solvent is lower than the surface tension of the porous base material by 8 mN/m or more and 15 mN/m or less.

6. The method of preparing the conductive composite according to claim 1, wherein the porous base material comprises a polyurethane-based polymer, and the solvent comprises an ester group (—C(=O)—O—) in the molecule.

7. The method of preparing the conductive composite according to claim 6, wherein the solvent comprises one or more selected from the group consisting of: diethylene glycol monoethyl ether acetate, propylene glycol phenyl ether, and propylene glycol monomethyl ether.

8. The method of preparing the conductive composite according to claim 1, wherein the conductive coating solution comprises 1 to 5% by weight of the conductive particles and 60 to 80% by weight of the solvent.

9. The method of preparing the conductive composite according to claim 1,
   wherein the conductive coating solution comprises 1 to 5% by weight of a dispersant and 5 to 25% by weight of a binder.

10. A conductive composite prepared by the method of claim 1.

11. A piezoresistive device comprising the conductive composite of claim 10.

12. A piezoresistive sensor or piezoresistive switch comprising the piezoresistive device of claim 11.

* * * * *